United States Patent
Davey et al.

(10) Patent No.: US 7,787,253 B1
(45) Date of Patent: Aug. 31, 2010

(54) DATA CENTER RACK MOUNT LOADING SYSTEM

(75) Inventors: Andrew L. Davey, Overland Park, KS (US); David W. Haney, Richmond, KS (US); Christopher J. Mateski, Overland Park, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 226 days.

(21) Appl. No.: 12/050,520

(22) Filed: Mar. 18, 2008

(51) Int. Cl.
*H05K 7/16* (2006.01)
*A47B 81/00* (2006.01)

(52) U.S. Cl. .................. 361/727; 312/223.1; 312/223.2

(58) Field of Classification Search .................. 316/727, 316/725, 826, 683; 211/26; 312/350, 236, 312/223.1–223.3; 361/678, 688–723, 724–727, 361/679.49, 679.5, 679.51, 679.52, 679.53, 361/679.54; 454/184, 186; 174/679.01–679.45
See application file for complete search history.

(56) References Cited

U.S. PATENT DOCUMENTS

| | | | |
|---|---|---|---|
| 2,891,677 A | * | 6/1959 | Ritchie ...................... 211/59.2 |
| 6,320,734 B1 | * | 11/2001 | Sonobe et al. .............. 361/103 |
| 6,360,900 B1 | * | 3/2002 | Carbonneau et al. .......... 211/26 |
| 2003/0168414 A1 | * | 9/2003 | Lauchner et al. .............. 211/26 |
| 2004/0124753 A1 | | 7/2004 | Stoller et al. |
| 2005/0212390 A1 | * | 9/2005 | Silvestro et al. .......... 312/334.4 |

* cited by examiner

*Primary Examiner*—Jayprakash N Gandhi
*Assistant Examiner*—Jerry Wu (57) ABSTRACT

A framework installation guide assembly is provided that is selectively attachable to mounting rails of an electronic enclosure cabinet. The mounting rails include a plurality of mounting apertures at predetermined intervals. The framework includes a set of guide rails extending into the electronic enclosure cabinet. A first mounting bracket and a second mounting bracket are affixed to a first guide rail and second guide rail, respectively, for selectively coupling the guide rails to the vertical mounting rails using fasteners at a selected one of the mounting apertures. An array of rollers is coupled to the first guide rail and the second guide rail for providing support to a bottom-side surface of the electronic component. The array of rollers further provides a slidable support surface for allowing the electronic component to be moved to a position for securing the electronic component to the mounting rails of the electronic enclosure cabinet.

16 Claims, 5 Drawing Sheets

DATA CENTER RACK MOUNT LOADING SYSTEM

CROSS-REFERENCE TO RELATED APPLICATIONS

Not Applicable.

STATEMENT REGARDING FEDERALLY SPONSORED RESEARCH

Not Applicable.

BACKGROUND OF THE INVENTION

This invention relates in general to rack mounting of electronic units in enclosure cabinets, and more specifically to apparatus for assisting the installation of such a unit to the cabinet.

Electronic enclosure cabinets, which are often referred to as rack mount systems, are used for mounting various electronic modules in a stackable configuration. The electronic devices mounted within the electronic enclosure cabinet are those typically utilized in a data center for telecommunications, electronics, and computer industries.

A standard electronic enclosure cabinet (e.g., constructed according to the ANSI/EIA 310 specification) consists of two parallel metal strips extending vertically at the front corners of the electronic enclosure cabinet. A plurality of apertures are formed in each of the metal strips at matching intervals.

Electronic modules mounted to the electronic enclosure cabinet typically include a flanged face plate having apertures on the flanged portion of the face plate. The apertures in the face plate align with apertures in the metal strips. Fasteners inserted through the mating apertures of the face plate and respective metal strips secure the electronic modules to the electronic enclosure cabinet. The electronic modules typically have the same standard width (e.g., 19 inches) so that the apertures in the face plate align with the apertures of the metal strips. The heights of the electronic modules, however, may vary. As a result of the varying height of various electronic modules mounted within an electronic enclosure cabinet, shelving is not utilized so that the stacking of the electronic modules may be optimized. Otherwise, wasted space may occur due to the volume taken up by the shelves. That is, the elimination of shelving allows the electronic modules to be mounted substantially close to one another for optimizing the number of electronic modules that may be disposed within an electronic cabinet.

A potential difficulty associated with not utilizing shelving is that when especially heavy electronic modules are being mounted more than one person may be required. Prior to the electronic module becoming secured to the electronic enclosure cabinet, there is no support to maintain the electronic device at the desired height other than providing a person to lift and hold the electronic module. Depending on the weight of the electronic module, more than one person may be required to maintain the electronic module at the desired mounting location (e.g., one in the front of the cabinet and one in the rear of the cabinet). In addition to the person(s) supporting the electronic module at its desired mounting location, an addition person may be needed to insert the fasteners (e.g. bolts) through the mating mounting apertures and secure the fasteners (e.g., via a nut) to the mounting rails for securing the electronic module. The same difficulties arise for detaching the hardware from the electronic enclosure cabinet. Moreover, if testing is being performed involving multiple electronic devices being repeatedly swapped in and out of the electronic enclosure cabinet, then the multiple personnel assisting the operation must remain at the enclosure cabinet throughout this process. It would be desirable to reduce the need for such assistants.

SUMMARY OF THE INVENTION

The present invention has the advantage of utilizing a detachable mounting apparatus in an electronic enclosure cabinet at any available elevation within the electronic enclosure cabinet which allows a single person to position the electronic module at the desired mounting location and secure the electronic module to the electronic enclosure cabinet without the assistance of another person. The mounting apparatus provides rollers so that the electronic device may be easily slidable within the electronic enclosure cabinet for attaching and detaching the electronic module within the cabinet.

In one aspect of the present invention, a framework installation guide assembly is provided that is selectively attachable to mounting rails of an electronic enclosure cabinet. The mounting rails include a plurality of mounting apertures at predetermined intervals. The framework includes a set of guide rails extending into the electronic enclosure cabinet. The set of guide rails is in spaced relation to one another. A first mounting bracket is affixed to a first guide rail for selectively coupling the first guide rail to a first mounting rail of the electronic enclosure cabinet using fasteners at selected one of the mounting apertures. A second mounting bracket is affixed to a second guide rail for selectively coupling the second guide rail to a second mounting rail of the electronic enclosure cabinet using fasteners at selected one of the mounting apertures. An array of rollers is coupled to the first guide rail and the second guide rail for providing support to a bottom-side surface of the electronic component. The array of rollers further provides a slidable support surface for allowing the electronic component to be moved to a position for securing the electronic component to the mounting rails of the electronic enclosure cabinet.

In another aspect of the invention, a framework installation guide assembly is provided that selectively attaches to mounting rails of an electronic enclosure cabinet. The framework includes at least one mounting bracket that is configured to be selectively secured to the mounting rails of the electronic enclosure cabinet. A set of guide rails in spaced relation to one another is affixed to the at least one mounting bracket. The set of guide rails extends perpendicular from the mounting rails into the electronic enclosure cabinet. A plurality of rollers is coupled to the set of guide rails. The plurality of rollers provides support to a bottom-side surface of the electronic component. The plurality of rollers provides a slidable surface to position the electronic component within the electronic enclosure cabinet for attachment to the mounting rails of the electronic enclosure cabinet.

In still another aspect of the invention, a method is provided for positioning and securing an electronic component within an electronic enclosure cabinet. A framework installation guide assembly is provided that includes a plurality of rollers. The plurality of rollers provides a slidable surface for supporting and positioning an electronic component. The framework installation guide assembly is secured to the mounting rails of the electronic enclosure cabinet. The framework is disposed within the electronic enclosure cabinet. The electronic component set on the plurality of rollers. The electronic component is positioned against the mounting rails of the electronic enclosure cabinet by sliding the electronic component on the plurality of rollers until a mounting face on the electronic component abuts the mounting rails of the electronic enclosure cabinet. The electronic component is secured to the mounting rails of the electronic enclosure cabinet.

Various objects and advantages of this invention will become apparent to those skilled in the art from the following detailed description of the preferred embodiment, when read in light of the accompanying drawings.

DETAILED DESCRIPTION OF PREFERRED EMBODIMENTS

Figure 1:
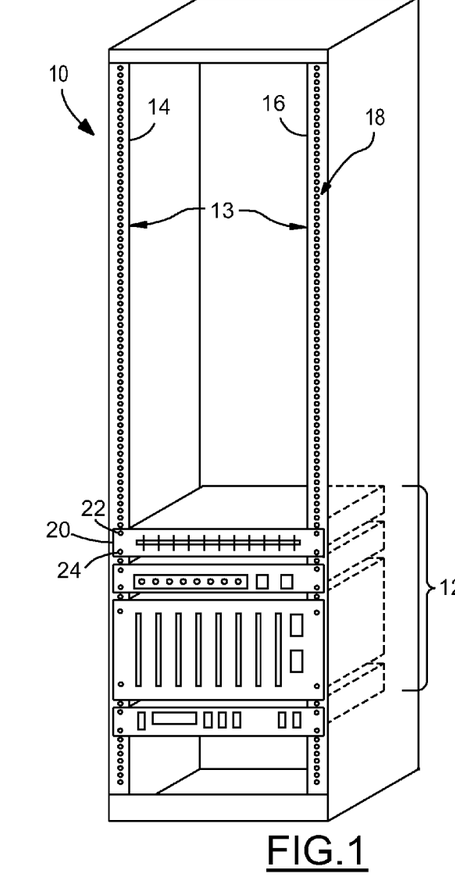
FIG. 1 is a of an electronic enclosure cabinet.

Referring now to the drawings, there is illustrated in FIG. 1 an electronic enclosure cabinet 10 for mounting a plurality of electronic modules 12. The electronic enclosure cabinet 10 is an open frame box-like structure. A front portion of the electronic enclosure cabinet 10 includes a set of mounting rails 13 comprising a first mounting rail 14 and a second mounting rail 16. The set of mounting rails 13 is preferably made from metal to provide structural stability for supporting electronic modules 12 during the mounting or demounting thereof. The first mounting rail 14 and the second mounting rail 16 of the electronic enclosure cabinet 10 each extend vertically and are parallel to one another.

The first mounting rail 14 and the second mounting rail 16 each include a plurality of apertures 18. The plurality of apertures 18 are disposed at spaced intervals along each respective mounting rail. Each respective aperture on the first mounting rail 14 is horizontally aligned with a respective aperture on the second mounting rail 16. Each of the apertures of each respective mounting rail is adapted to receive a fastener therethrough for securing a respective electronic module to the electronic enclosure cabinet 10.

The plurality of electronic modules 12 each includes a flanged face plate 20. The width of a body of the each respective electronic module 12 is smaller than the spacing between the first mounting rail 14 and the second mounting rail 16 so that substantially the entire body of the electronic module 12 may pass between the set of mounting rails 13 for residing within an interior 17 of the electronic enclosure cabinet 10. A width of each respective flanged face plate 20 is greater than the spacing between the set of mounting rails 13 so that flange of the face plate 20 functions as an abutment surface for preventing the flanged face plate 20 from passing between set of mounting rails 13 of the electronic enclosure cabinet 10.

Each flanged face plate 20 typically includes at least two apertures 22 disposed on each side of the flange face plate 20 for receiving fastening members 24 therethrough. The apertures 22 on each side of the flanged face plate 20 align with respective apertures in the first mounting rail 14 and the second mounting rail 16. Fastening members 24 are inserted through the aligned apertures of the flanged face plate 20 and set of mounting rails 13 for securing the electronic module 13 to the electronic enclosure cabinet 10 in a conventional manner.

Figure 2:
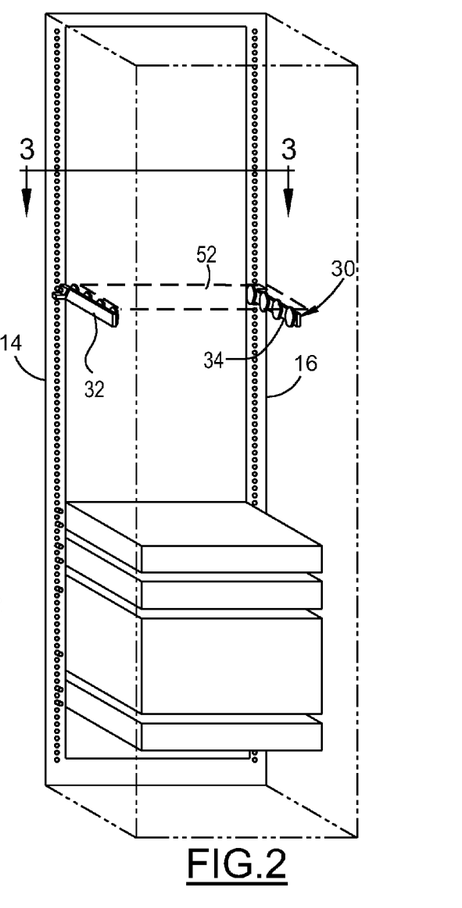
FIG. 2 is a perspective view of a framework guide assembly in the electronic enclosure cabinet according to a first preferred embodiment of the present invention.
Figure 3:
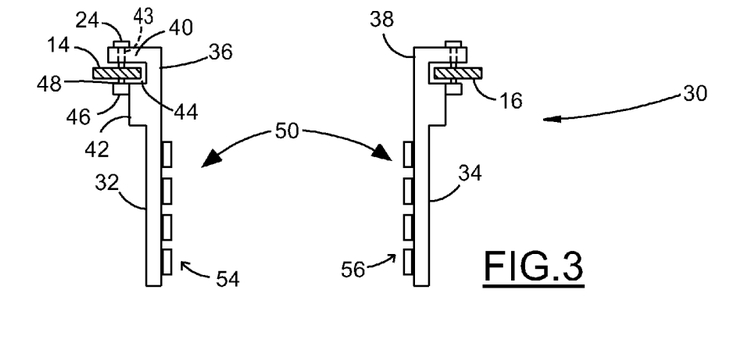
FIG. 3 is a top view of the framework guide assembly of FIG. 2.

FIGS. 2 and 3 illustrate a framework installation guide assembly 30 according to a first embodiment that provides assistance to a user when mounting the electronic module 12 within the electronic enclosure cabinet 10. The framework assembly 30 includes two symmetrical pieces selectively attachable to the first mounting rail 14 and the second mounting rail 16 of the electronic enclosure cabinet 10.

In this first embodiment, the framework installation guide 30 includes a first guide rail 32 and a second guide rail 34 in spaced relation to one another that are selectively attachable to the first mounting rail 14 and the second mounting rail 16 of the electronic enclosure cabinet 10. When the framework guide 30 is attached to the electronic enclosure cabinet 10, the first guide rail 32 and the second guide rail 34 extend horizontally into the electronic enclosure cabinet 10 perpendicular to first mounting rail 14 and second mounting rail 16. respectively.

Figure 4:
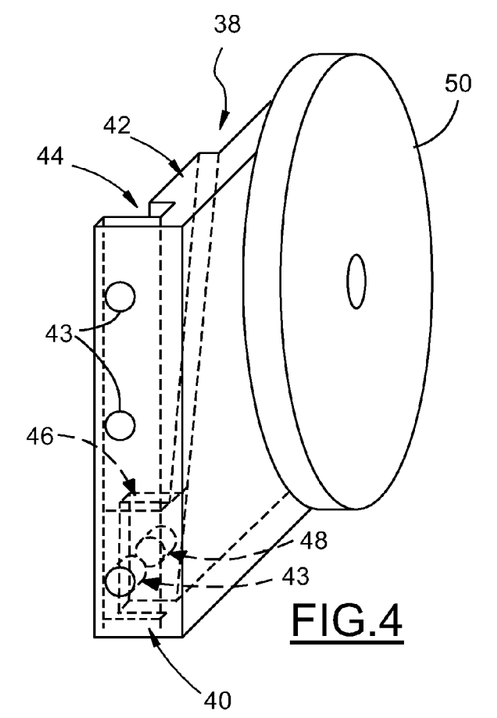
FIG. 4 is a perspective view of a bracket member of the framework guide assembly according to the first preferred embodiment of the present invention.
Figure 5:
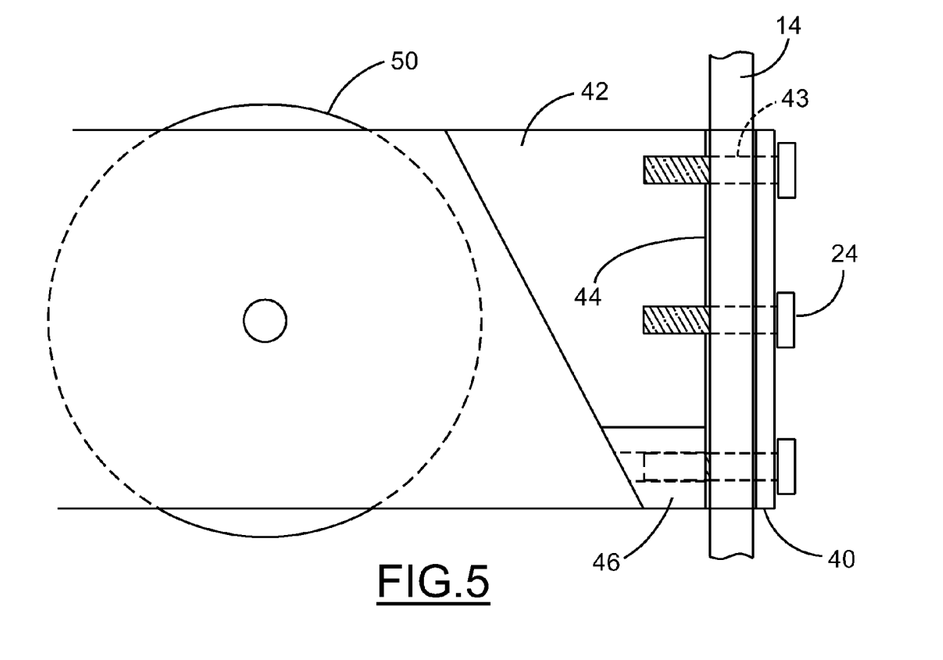
FIG. 5 is a side view of the bracket member of the framework guide assembly according to the first preferred embodiment of the present invention.

A first attachment bracket 36 and a second attachment bracket 38 are formed integral to the first guide rail 32 and the second guide rail 34, respectively. FIGS. 4 and 5 illustrate enlarged views of the attachment brackets. The first mounting bracket 36 includes a flanged member 40 and a first strengthening member 42 for providing support to the first guide rail 32. The first strengthening member 42 preferably has an overall shape this is generally triangular for providing additional strength to the first guide rail 32 as the first guide rail 32 cantilevers into the interior 17 of the electronic enclosure cabinet 10 to support the electronic module 12.

Flanged member 40 of the first mounting bracket 36 includes a plurality of apertures 43 for receiving fastening members 24 therethrough for attachment to the mounting rail 14. The plurality of apertures 43 of the first mounting bracket 36 are aligned with respective apertures of the first mounting rail 14. The fastening members 24 are received through each set of the aligned apertures for selectively coupling the first mounting rail 14 to the electronic enclosure cabinet 10. Fasteners 24 are shown threaded for receiving corresponding nuts (not shown). Other known types of fasteners could also be used.

First mounting bracket 36 further includes a slotted portion 44 formed between the flanged member 40 and the first strengthening member 42 for receiving the mounting rail 14 therein. The slotted portion 44 encases a portion of the mounting rail 14 for providing structural support to the first guide rail 32 in addition to the fastening members 24. Seating the mounting rail 14 within the slotted portion 44, in cooperation with the fastening members 24, prevents the first guide rail 32 from tilting and pulling away from the mounting rail 14 as the first guide rail 32 cantilevers into the interior 17 of the electronic enclosure cabinet 10.

The first strengthening member 42 of the first mounting bracket 36 further includes a second strengthening member 46 formed integral to the first strengthening member 42. The second strengthening member 46 is preferably a box-like structure, or any other extended shape, having an aperture 48 axially aligned with the corresponding mounting aperture 43 of flanged member 40 for receiving a respective fastening member therethrough. That is, a respective fastening member will be inserted through a respective aperture of the flanged member 40, through a respective aperture of the mounting rail 14 seated within the slotted portion 44, and into the second strengthening member 46. Aperture 48 may be threaded for receiving complementary threads of fastener 24, for example. Preferably, the second strengthening member 46 is formed and aligned with the lowest respective aperture of the flanged member 40 which provides the optimum support when mounting to the first guide rail 32. Alternatively, the second strengthening member 46 may be aligned with other respective apertures of the flanged member 40 that may provide optimal support depending on the construction of the first strengthening member.

The second mounting bracket 38 of the second guide rail 34 is substantially a mirror image of the first mounting bracket 36. Therefore, the details of the second mounting bracket 38 will not be discussed further.

Framework assembly 30 further includes an array of rollers 50 coupled to the first guide rail 32 and the second guide rail 34 for providing support to a bottom-side surface of a respective electronic module when being installed within the electronic enclosure cabinet 10. The array of rollers 50 provide a slidable support surface 52 (FIG. 2) for allowing the electronic module 12 to be moved to a position for securing the electronic component to the first mounting rail 14 and the second mounting rail 16.

A first set of rollers 54 are coupled to the first guide rail 32. Each individual roller within first set of rollers 54 are positioned inline with one another. Similarly, second set of rollers 56, positioned inline to one another, are coupled to the second guide rail 34. Each of the respective rollers in the arrays of rollers 54 and 56 is rotatably attached by a hub. The slidable surface 52 allows the electronic module 12 to be easily moved in and out of the electronic enclosure cabinet 10. In addition, each respective roller extends a predetermined height above the respective guide rails for locating the electronic component 12 at a predetermined vertical position for securing the electronic module 12 to the set of mounting rails 13.

Figure 6:
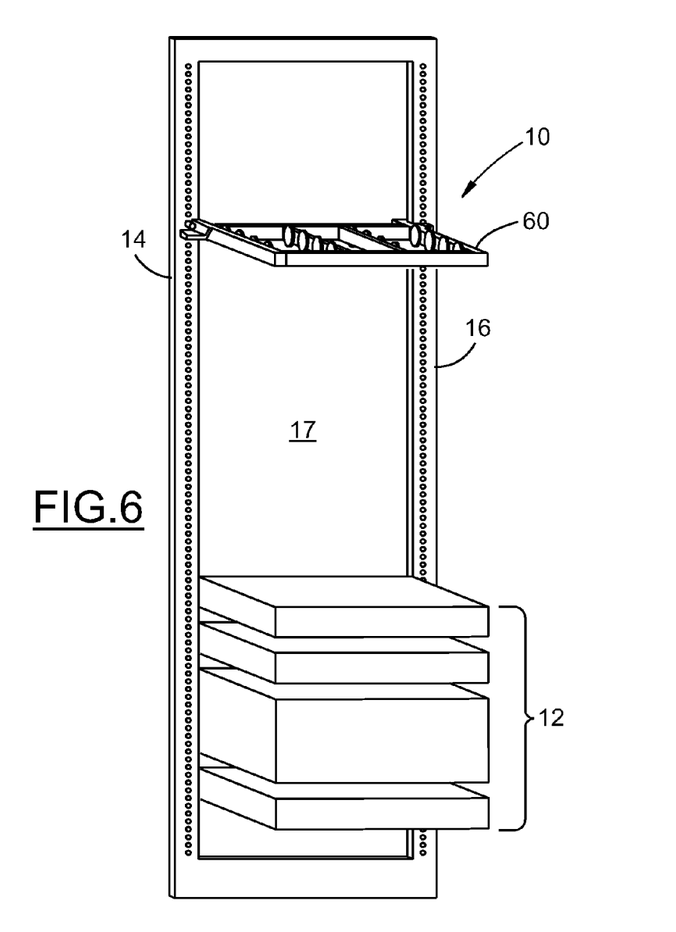
FIG. 6 is a perspective view of a framework guide assembly in the electronic enclosure cabinet according to a second preferred embodiment of the present invention.
Figure 7:
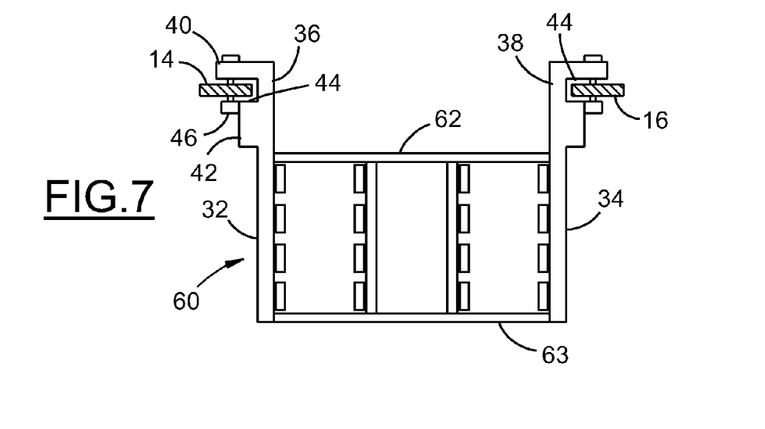
FIG. 7 is a top view of the framework guide assembly in the electronic enclosure cabinet according to the second preferred embodiment of the present invention.

FIGS. 6 and 7 illustrate a framework guide assembly 60 according to a second preferred embodiment. The first guide rail 32 and the second guide rail 34 are substantially the same as that shown in FIG. 2. First and second guide rails 32 and 34 are connected by a cross-beam member 62 for providing additional stiffening when the electronic module 12 is disposed on the slidable surface 56 of the framework guide 60. The cross-beam member 62 extends perpendicular to guide rails 32 and 34. The cross beam member 62 may be formed integral to the first and second guide rails 32 and 34 or may be selectively affixed to the first and second guide rails 32 and 34. In this preferred embodiment, the cross beam member 62 is set back rearward along the first guide rail 32 and second guide rail 34 from the first strengthening member 42 of each respective mounting bracket. This allows the first and second mounting brackets 36 and 38 to flex inwardly so the mounting rails 14 and 16 may be seated within the slotted portions 44. That is, the first and second guide rails 32 and 34 are spaced a predetermined distance apart for allowing the majority of the first and second guide rails 32 and 34 to be inserted between the mounting rails 14 and 16. The first strengthening member 42 and second strengthening member 46 would potentially block the framework guide 60 from being fully inserted within the interior 17 of the electronic enclosure cabinet 10. Affixing the cross beam member 62 spaced rearwardly along the first and second guide rails 32 and 34 can allow the respective mounting brackets to be flexed inward so that the first and second strengthening members 42 and 46 may slide past the first and second mounting rails 14 and 16, respectively. The respective mounting brackets will resume their unflexed position when the mounting rails 14 and 16 are received in the respective slotted portions 44. In alternative embodiments, the cross-beam member 62 may be disposed at any other desired location between the guide rails that allow flexing of the respective portions of each mounting bracket to allow the mounting rails to be inserted within the slotted portions.

In alternative embodiments, the framework guide 30 may include additional front-to-back guide rails extending from the cross-beam member 62 into the electronic enclosure cabinet 10. The respective ends of each respective guide rail are affixed to the cross-beam member. Each of the additional guide rails includes a respective set of rollers inline to one another. The number of guide rails within the framework guide 60 may include more or less than that shown in FIGS. 6 and 7. In addition, the framework guide 60 may include a side-to-side crossbeam member 63 for providing structural support to the each of the respective guide rails as each guide rail cantilevers from the cross-beam member 62.

Figure 8:
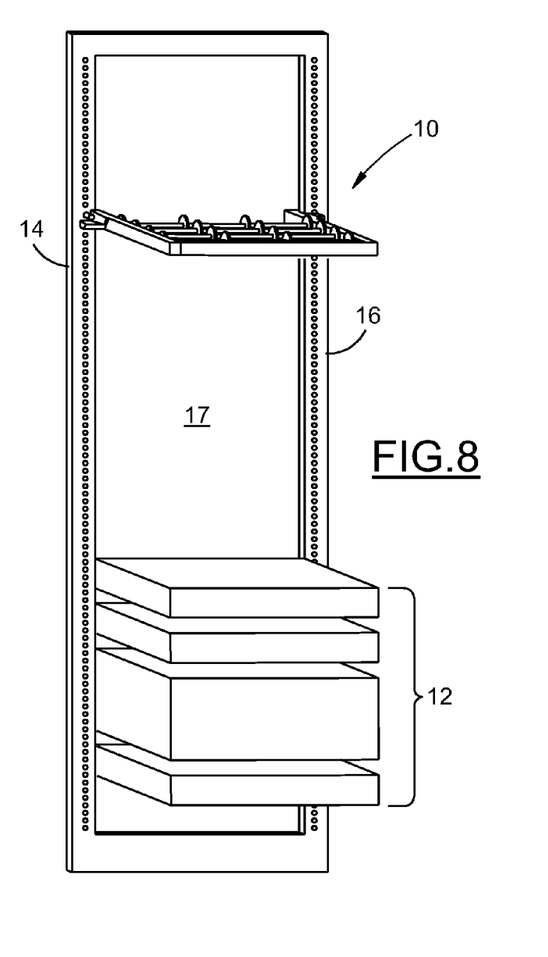
FIG. 8 is a perspective view of a framework guide assembly in the electronic enclosure cabinet according to a third preferred embodiment of the present invention.
Figure 9:
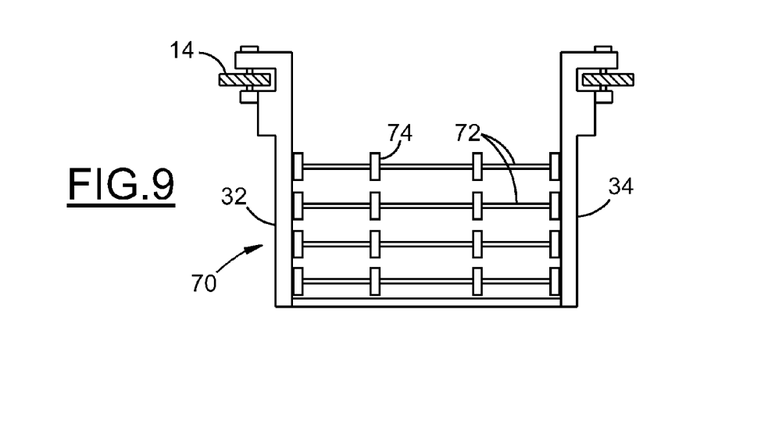
FIG. 9 is a top view of the framework guide assembly in the electronic enclosure cabinet according to the third preferred embodiment of the present invention.

FIGS. 8 and 9 illustrate a framework guide 70 according to a third preferred embodiment. The framework assembly 70 includes a plurality of cross-rod members 72 extending between first guide rail 32 and second guide rail 34. Each cross-rod member is inserted through a respective set of rollers 74 for coupling each roller to the framework assembly 70. The plurality of cross-rod members 72 function as an axle for each of the rollers. Each set of rollers 74 rotate about a respective cross-rod member 72 for providing the slidable surface for inserting an electronic module 12.

Figures 10, 11:
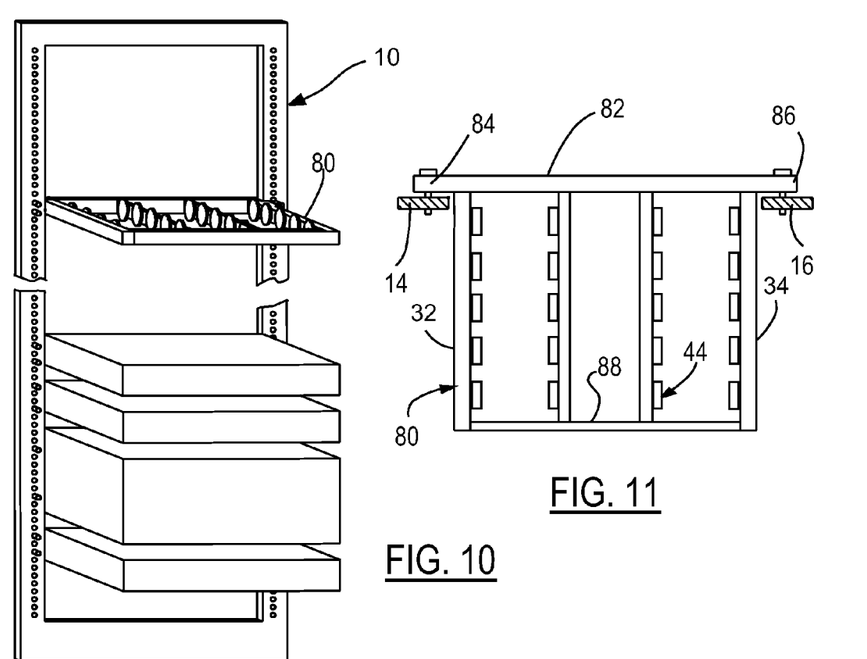
FIG. 10 is a perspective view of a framework guide assembly in the electronic enclosure cabinet according to a third preferred embodiment of the present invention.
FIG. 11 is a top view of the framework guide assembly in the electronic enclosure cabinet according to the third preferred embodiment of the present invention.
Figure 12:
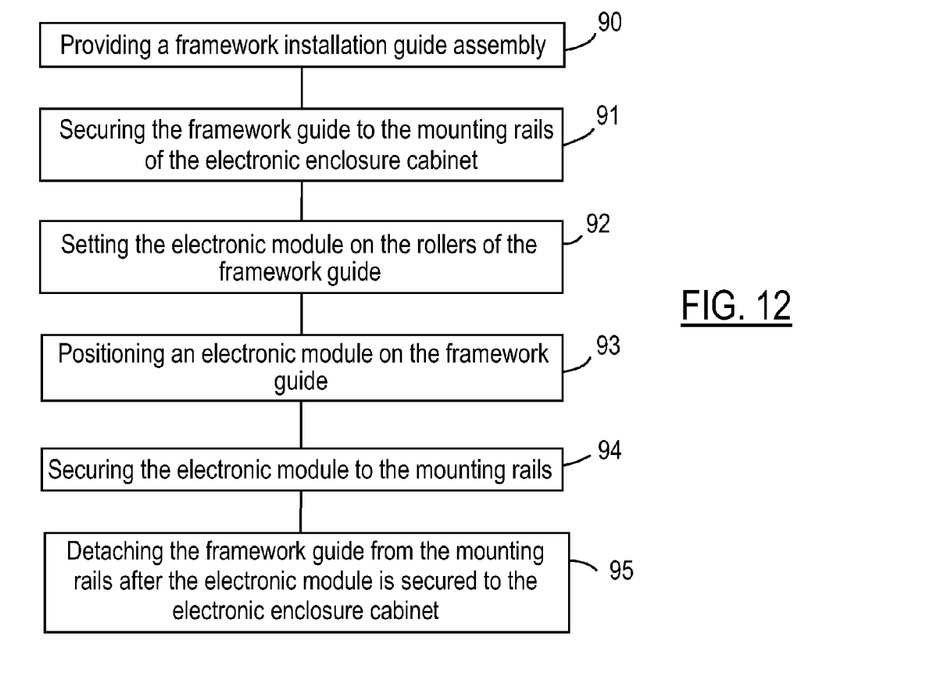
FIG. 12 is a flowchart for a method of selectively attaching the framework guide assembly within the electronic enclosure cabinet.

FIGS. 10 and 11 illustrate a framework guide 80 according to a fourth preferred embodiment. The framework guide 80 includes the first guide rail 32 and the second guide rail 34. The respective mounting brackets include flange portions for attachment to the mounting rails 14 and 16 of the electronic enclosure cabinet 10. Portions of the respective mounting brackets extending past the mounting rails are substantially planar for allowing the first and second rails 32 and 34 to be inserted within the interior 17 without any flexing. A first cross-beam member 82 is coupled between the flange portions 84 and 86 for providing structural support to a front portion of the framework guide 80. In addition, a second cross-beam member 88 is coupled between the rear ends of the first and second guide rails 32 and 34 for providing strengthening support to the framework guide 80. The framework 80 provides a box-like frame around the array of rollers 44. The framework guide 80 may have more or less guide rails extending between the first cross beam member 82 and the second cross beam member 88 than shown.

After an electronic module is secured to the set of mounting rails using support of an attached framework guide, the framework guide may be detached from the set of mounting rails and removed from the electronic enclosure cabinet. Alternatively, if the electronic module within the electronic enclosure cabinet is being mounted for only a short duration of time, such as for testing purposes, the framework guide may remain attached within the electronic enclosure cabinet without any concern of obstruction with the other adjacent electronic modules. Moreover, the rollers and brackets are separated by open space which allows for passage of wires and other conduits to be routed through the framework guide to other adjacent electronic modules. Moreover, each roller being in spaced relation to one another provide for ventilation air flow below the supported electronic module.

FIG. 10 illustrates a method for positioning and securing the electronic module within the electronic enclosure cabinet. In step 60, a framework installation guide assembly is provided that includes a plurality of rollers. The plurality of rollers provides a slidable surface for supporting and positioning the electronic module. In step 61, the framework installation guide assembly is secured to the mounting rails of the electronic enclosure cabinet. The framework assembly is disposed within the electronic enclosure cabinet. In step 62, the electronic module is set on the plurality of rollers. In step 63, the electronic module is positioned against the mounting rails of the electronic enclosure cabinet by sliding the electronic module on the plurality of rollers until the mounting face on the electronic module abuts the mounting rails of the electronic enclosure cabinet. In step 64, the electronic module is secured to the mounting rails of the electronic enclosure cabinet. In step 65, after the electronic module is secured to the mounting rails, the framework assembly is detached from the mounting rails of the electronic enclosure cabinet and framework assembly is removed from the electronic enclosure cabinet.

What is claimed is:

1. A framework installation guide assembly selectively attachable to vertical mounting rails of an electronic enclosure cabinet for temporarily supporting an electronic module until it is attached to the mounting rails, the mounting rails providing a plurality of mounting apertures at predetermined intervals, the framework comprising:

first and second guide rails extending into the electronic enclosure cabinet in spaced relation to one another;

a first mounting bracket affixed to the first guide rail for selectively coupling the first guide rail to a first mounting rail of the electronic enclosure cabinet using fasteners at a selected one of the mounting apertures below a first predetermined aperture to which the electronic module is being attached;

a second mounting bracket affixed to the second guide rail for selectively coupling the second guide rail to a second mounting rail of the electronic enclosure cabinet using fasteners at another selected one of the mounting apertures below a second predetermined aperture to which the electronic module is being attached; and an array of rollers coupled to the first guide rail and the second guide rail for providing support to a bottom-side surface of the electronic module, the array of rollers allowing the electronic module to be rolled to a position for aligning the electronic module with the first and second predetermined apertures of the electronic enclosure cabinet.

2. The framework of claim 1 wherein the first and second guide rails extend horizontally into the electronic enclosure cabinet when attached to the mounting rails.

3. The framework of claim 2 wherein the array of rollers includes sets of rollers, wherein each roller of a respective set of rollers is coupled to a respective guide rail, and wherein each roller of the respective set of rollers is positioned in-line with one another.

4. The framework of claim 3 wherein the array of rollers are in spaced relation to one another to provide open spaces between the guide rails, the open spaces adapted to provide access for wiring the electronic component to a second electronic component disposed below the plurality of rollers.

5. The framework of claim 3 wherein the array of rollers are in spaced relation to one another to provide open spaces between the guide rails, the open spaces allowing ventilation air flow below the electronic component.

6. The framework of claim 3 further comprising at least one cross beam member for providing structural support to the first and second guide rails.

7. The framework of claim 6 wherein the crossbeam member is formed integral to the first and second mounting brackets.

8. The framework of claim 2 further comprising a plurality of cross-rod members extending perpendicularly between the first and second guide rails, wherein a respective set of rollers is coupled to a respective cross-rod member in spaced relation to one another, the rollers being rotatable on the cross-rod member.

9. The framework of claim 8 wherein the array of rollers define a sliding surface a predetermined distance above the guide rails for locating the electronic module at a predetermined vertical position for securing the electronic module to the mounting rails.

10. The framework of claim 1 wherein the mounting brackets include flange portions for mounting to the first and second mounting rails.

11. The framework of claim 10 wherein the mounting brackets each include a first strengthening member for providing added support to the mounting brackets at the mounting rail locations.

12. The framework of claim 11 wherein mounting brackets further include respective slotted portions disposed between the flange member and the first strengthening member for seating the respective mounting rails therein.

13. The framework of claim 11 wherein the first strengthening member is a triangular-shaped strengthening member.

14. The framework of claim 11 further comprising a second strengthening member formed integral to a lower portion of the first strengthening member, the second strengthening member receiving one of the fastening members therethrough.

15. The framework of claim 14 wherein the second strengthening member is a box-like structural support member.

16. A method for positioning and securing an electronic module to an electronic enclosure cabinet, wherein the electronic enclosure cabinet includes vertical mounting rails, the method comprising the steps of:

providing a framework installation guide assembly that includes a plurality of rollers, the plurality of rollers providing a slidable surface for supporting and positioning the electronic module;

securing the framework installation guide assembly to the mounting rails of the electronic enclosure cabinet, the framework being disposed within the electronic enclosure cabinet;

setting the electronic module on the plurality of rollers;

positioning the electronic module against the mounting rails of the electronic enclosure cabinet by sliding the electronic module on the plurality of rollers until a mounting face on the electronic module abuts the mounting rails of the electronic enclosure cabinet;

securing the electronic module to the mounting rails of the electronic enclosure cabinet; and detaching the framework installation guide assembly from the mounting rails of the electronic enclosure cabinet.

* * * * *